(12) United States Patent
Siegfried et al.

(10) Patent No.: US 12,156,342 B2
(45) Date of Patent: Nov. 26, 2024

(54) SYSTEMS AND METHODS FOR SHAPING FLEXIBLE CIRCUITS TO IMPROVE ROUTING AND ATTACHMENT

(71) Applicant: APTIV TECHNOLOGIES LIMITED, St. Michael (BB)

(72) Inventors: David G. Siegfried, Warren, OH (US); David R. Peterson, Aurora, OH (US); Joseph Sudik, Jr., Niles, OH (US)

(73) Assignee: APTIV TECHNOLOGIES AG, Schaffhausen (CH)

( * ) Notice: Subject to any disclaimer, the term of this patent is extended or adjusted under 35 U.S.C. 154(b) by 107 days.

(21) Appl. No.: 17/889,473

(22) Filed: Aug. 17, 2022

(65) Prior Publication Data

US 2024/0064908 A1    Feb. 22, 2024

(51) Int. Cl.
| | | |
|---|---|---|
| *H05K 1/02* | (2006.01) | |
| *B60R 16/02* | (2006.01) | |
| *H01L 21/268* | (2006.01) | |
| *H05K 1/18* | (2006.01) | |
| *H05K 3/00* | (2006.01) | |
| *H05K 3/14* | (2006.01) | |
| *H05K 3/16* | (2006.01) | |

(52) U.S. Cl.
CPC ........... *H05K 3/0014* (2013.01); *B60R 16/02* (2013.01); *H05K 1/0212* (2013.01); *H05K 1/189* (2013.01); *H05K 3/0026* (2013.01)

(58) Field of Classification Search
CPC ...... H05K 1/02; H05K 1/0212; H05K 1/0393; H05K 1/147; H05K 1/162; H05K 1/165; H05K 1/189; H05K 3/0014; H05K 3/0026; H05K 2201/1056; H05K 2201/10159; B60R 16/02; H01L 21/0243; H01L 21/02532; H01L 21/02587; H01L 21/02658; H01L 21/02672; H01L 21/02683; H01L 21/268; H01L 23/3121; H01L 23/4985; A61N 1/0456; A61N 1/0492; A61N 1/3603; A61N 1/36014
USPC .......... 361/749; 428/141; 438/106, 112, 479
See application file for complete search history.

(56) References Cited

U.S. PATENT DOCUMENTS

| | | |
|---|---|---|
| 5,097,101 A | 3/1992 | Trobough |
| 5,219,640 A | 6/1993 | Gazit et al. |
| 2008/0131663 A1* | 6/2008 | Tanaka ................ H01L 27/1285 438/479 |

(Continued)

OTHER PUBLICATIONS

Extended European Search Report for EP23179564.2 dated Jan. 25, 2024, 8 pages.

*Primary Examiner* — Xiaoliang Chen
(74) *Attorney, Agent, or Firm* — Miller Johnson (57) ABSTRACT

A system and method for shaping a flexible circuit (FC) having a set of conductive traces disposed within a set of insulation layers and a shaped FC, each involve using a non-conductive tool defining complimentary first and second tool portions and a shape therebetween, the tool being configured to receive a portion of the FC therebetween the first and second tool portions, a set of conductive heating elements arranged substantially in parallel with each other and disposed within the first and second tool portions, and a power source configured to provide power to the conductive heating elements causing the conductive heating elements to generate heat energy to shape the FC portion without removing any of the FC portion.

22 Claims, 6 Drawing Sheets

(56) References Cited

U.S. PATENT DOCUMENTS

2012/0281411 A1 11/2012 Kajiya et al.
2022/0062621 A1* 3/2022 Hogg .................. A61N 1/0456

* cited by examiner

SYSTEMS AND METHODS FOR SHAPING FLEXIBLE CIRCUITS TO IMPROVE ROUTING AND ATTACHMENT

FIELD

The present application generally relates to flexible circuits (FCs) and, more particularly, to systems and methods for shaping FCs to improve routing and attachment, such as in an electrical system of an electrified vehicle (EV).

BACKGROUND

In today's electrified vehicles (EVs), flexible circuits (FCs) are often utilized to connect a variety of different electrical components (controllers, sub-controllers, sensors/actuators, etc.). In order to improve routing and attachment of the FCs in a compact environment such as an EV, FCs can be pre-processed to increase their flexibility. For example, full-thickness slits in the insulation material between the conductive circuit traces can be formed. Such slits, however, tend to tear further than intended over time. In addition, fully singulating the conductive circuit traces can result in their damage, especially over time after repetitive routing. Thus, while these conventional FC processing systems do work for their intended purpose, there exists an opportunity for improvement in the relevant art.

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

According to one aspect of the present disclosure, a system for shaping a flexible circuit (FC) including a set of conductive traces disposed within a set of insulation layers is presented. In one exemplary implementation, the system comprises a non-conductive tool defining complimentary first and second tool portions and a shape therebetween, the tool being configured to receive a portion of the FC therebetween the first and second tool portions, a set of conductive heating elements arranged substantially in parallel with each other and disposed within the first and second tool portions, and a power source configured to provide power to the conductive heating elements causing the conductive heating elements to generate heat energy to shape the FC portion without removing any of the FC portion.

In some implementations, the shape is a waveform shape defining a series of peaks and valleys relative to the first and second tool portions. In some implementations, each conductive heating element is substantially aligned with a respective peak-valley pair in one of the first and second tool portions corresponding to a peak side of the respective peak-valley pair. In some implementations, the waveform shape is a triangular waveform shape for increasing flexibility or bendability of the FC perpendicular to its length. In some implementations, the waveform shape is a sinusoidal waveform shape for increasing rigidity or stiffness of the FC along its length.

In some implementations, the first and second tool portions are arranged in a clamp configuration joined on one respective side by a hinge member and moveable relative to each other such that, when the first and second tool portions are separated from each other in an open position, the FC portion is positionable therein, and when the first and second tool portions are proximate to each other in a closed position, the FC portion is secured therein for shaping. In some implementations, the first and second portions are fixed relative to each other defining a slot or gap therebetween for insertion and shaping of the FC portion therebetween. In some implementations, some conductive heating elements of the set of conductive heating elements have different lengths such that the shaping achieves different widths of bends/folds in at least some of the set of insulation layers.

In some implementations, the system further comprises a laser processing system configured to pre-process the FC portion to etch or remove a portion of the set of insulation layers in an area of the FC portion to promote the subsequent shaping. In some implementations, the power source is a battery system such that the system is movable to any desired position. In some implementations, the system further comprises an output device configured to generate at least one of an audible, visual, and tactile output after a shaping period of providing power to the set of conductive elements to shape the FC portion, wherein the shaping period has a sufficient duration to complete the shaping of the FC portion.

According to another aspect of the present disclosure, a method of shaping an FC including a set of conductive traces disposed within a set of insulation layers is presented. In one exemplary implementation, the method comprises: providing a non-conductive tool defining complimentary first and second tool portions and a shape therebetween, the tool being configured to receive a portion of the FC therebetween the first and second tool portions, providing a set of conductive heating elements arranged substantially in parallel with each other and disposed within the first and second tool portions, providing a power source configured to provide power to the conductive heating elements causing the conductive heating elements to generate heat energy, positioning the FC portion within the tool, and providing power to the conductive heating elements to shape the FC portion without removing any of the FC portion.

In some implementations, the shape is a waveform shape defining a series of peaks and valleys relative to the first and second tool portions. In some implementations, each conductive heating element is substantially aligned with a respective peak-valley pair in one of the first and second tool portions corresponding to a peak side of the respective peak-valley pair. In some implementations, the waveform shape is a triangular waveform shape for increasing flexibility or bendability of the FC perpendicular to its length. In some implementations, the waveform shape is a sinusoidal waveform shape for increasing rigidity or stiffness of the FC along its length.

In some implementations, the first and second tool portions are arranged in a clamp configuration joined on one respective side by a hinge member and moveable relative to each other such that, when the first and second tool portions are separated from each other in an open position, the FC portion is positionable therein, and when the first and second tool portions are proximate to each other in a closed position, the FC portion is secured therein for shaping. In some implementations, the first and second portions are fixed relative to each other defining a slot or gap therebetween for insertion and shaping of the FC portion therebetween. In some implementations, some conductive heating elements of the set of conductive heating elements have different lengths such that the shaping achieves different widths of bends/folds in at least some of the set of insulation layers.

In some implementations, the method further comprises providing a laser processing system configured to etch or remove a portion of the set of insulation layers of the FC, and pre-processing the FC portion with the laser processing system to promote the subsequent shaping. In some implementations, the power source is a battery system such that the tool with the set of conductive heating elements therein is movable to any desired position. In some implementations, the method further comprises providing an output device configured to generate at least one of an audible, visual, and tactile output, and actuating the output device after a shaping period of providing power to the set of conductive elements to shape the FC portion, wherein the shaping period has a sufficient duration to complete the shaping of the FC portion.

According to yet another aspect of the present disclosure, an FC is presented. In one exemplary implementation, the FC comprises: a set insulation layers, and a set of conductive circuit traces disposed within the set of one or more insulation layers, wherein the sets of insulation layers and conductive circuit traces collectively define a cross-sectional shape of the FC, and wherein the FC cross-sectional shape is a waveform shape to provide a desired alteration in flexibility/rigidity of the FC along one of its axes. In some implementations, the waveform shape is a triangular waveform shape for increasing flexibility or bendability of the FC perpendicular to its length. In some implementations, the waveform shape is a sinusoidal waveform shape for increasing rigidity or stiffness of the FC along its length. In some implementations, the set of insulation layers do not include any full-thickness slits or cuts therethrough.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

As previously discussed, slits in insulation material(s) between conductive circuit trace(s) of a flexible circuit (FC) can be formed to increase flexibility for routing and attachment. More specifically, FCs are often slit, cut, singulated, or otherwise separated, typically through their full or entire thickness and longitudinally, to allow FC assemblies to be easily bent, gathered, or twisted in a specific area of the FC. These conventional FC separation methods increases risk of FC damage by producing individual FC "catch points" and reducing the FC assembly tensile strength to a tensile strength of a single conductive circuit (plus insulation). Such slits, therefore, tend to tear further than intended over time. In addition, full singulation or separation often results in damage over time, especially after repetitive routing (e.g., during or after electrified vehicle electrical system maintenance). Thus, while these conventional FC processing systems do work well for their intended purpose, there exists an opportunity for improvement in the relevant art.

Accordingly, improved systems and methods for shaping portions of FCs are presented herein. As opposed to fully singulating or separating (e.g., cutting) the FC portion into a plurality of distinct portions each having a conductive circuit trace within insulation, the systems and methods herein utilize a unique tool having conductive heating elements therein that generate heat energy to shape the FC portion (i.e., to temporarily make the insulation layer(s) of the FC portion pliable or shapable). The resulting shaped FC does not suffer from the permanent slits/cuts of conventional techniques, which could result in further tearing and/or damage to the conductive circuit traces. The shaped FC is easily routable and attachable (e.g., bendable around a pole-type object) in a tight/crowded environment, such as an electrical system of an electrified vehicle (EV).

Figure 1A:
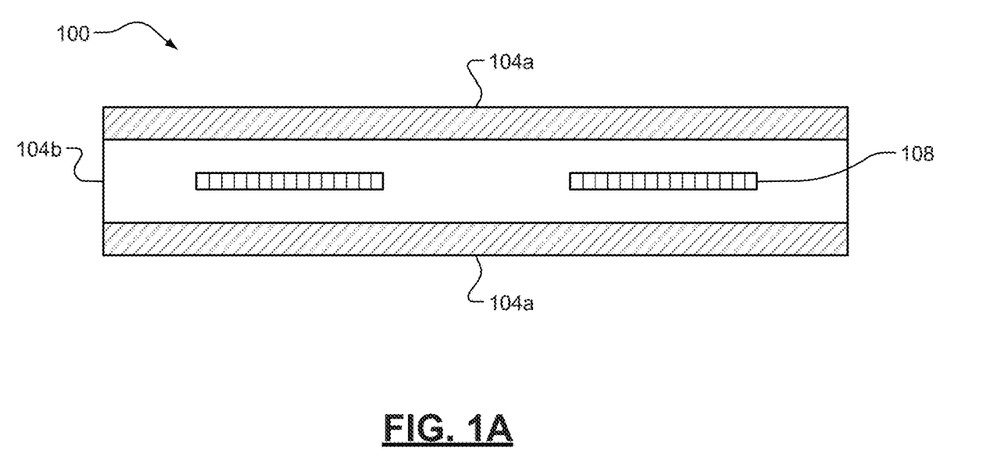
FIGS. 1A-1B are an end or cross-sectional view of an example flexible circuit (FC) and a functional block diagram of an example shaping system for an unshaped FC according to some implementations of the present disclosure.
Figure 1B:
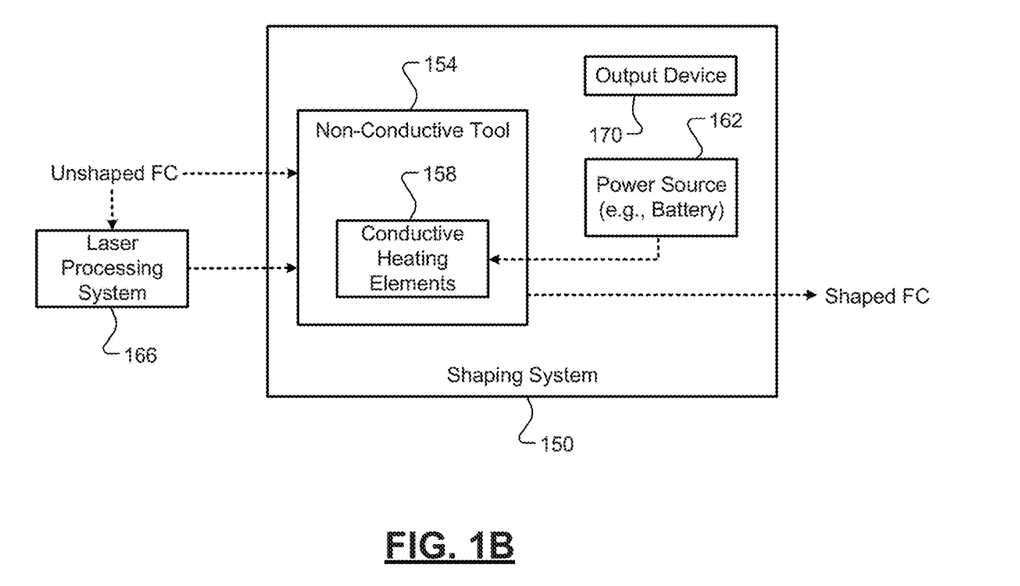

Referring now to FIGS. 1A-1B, an end or cross-sectional view of an example FC 100 and a functional block diagram of an example system 150 for shaping a portion of the FC 100 according to some implementations of the present disclosure are illustrated. In FIG. 1A, the FC 100 comprises a set of one or more conductive traces 108 formed of a conductive material (copper, aluminum, etc.) and arranged substantially parallel to each other lengthwise and within one or more dielectric or insulation layers 104. As shown, the FC 100 comprises two insulation layers 104*a* and 104*b*, which could be formed of different materials having different properties (flexibility, melting temperature, etc.). For example only, specific insulation materials could be chosen and subsequently laser-etched or otherwise removed as part of a pre-processing step as described more fully below. It will also be appreciated that the FC 100 could also include only a single dielectric or insulation layer 104. Each insulation layer is formed of a non-conductive laminate or thermoplastic material (e.g., a thermoplastic polymer resin), such as, but not limited to, polyethylene naphthalate (PEN) and polyethylene terephthalate (PET).

Referring now to FIG. 1B and with continued reference to FIG. 1A, the shaping process, as performed by example shaping system 150 and described more fully described below, generally involves mechanically folding or forming and materially resetting (via heat) the insulation layer(s) 104 incorporating a longitudinal or angular shape (e.g., a triangular or sinusoidal waveform) that allows the FC 100 to be collapsed or "pinched" in specific areas or sections without damage. The heat is applied at the bend or crease point along the length of the fold area to set the plastic and maintain the bend position during the cycle of folding or bending the FC 100. The temperature is dependent on the material(s) utilized for the insulation layer(s) 104. Thickness of material in the bend or crease may increase or decrease retention of the fold. Optionally, a cover or base film and/or an adhesive in the bend or crease could be removed without causing a cut edge in the insulation layer(s) 104 (retaining at least one layer of cover or base film to maintain FC stability). Depending on the amplitude, frequency, and angle of the fold pattern, the FC 100 can be shaped to meet in electrified vehicle routing and attachment requirements while maintaining the full strength of the FC 100.

Figure 3A:
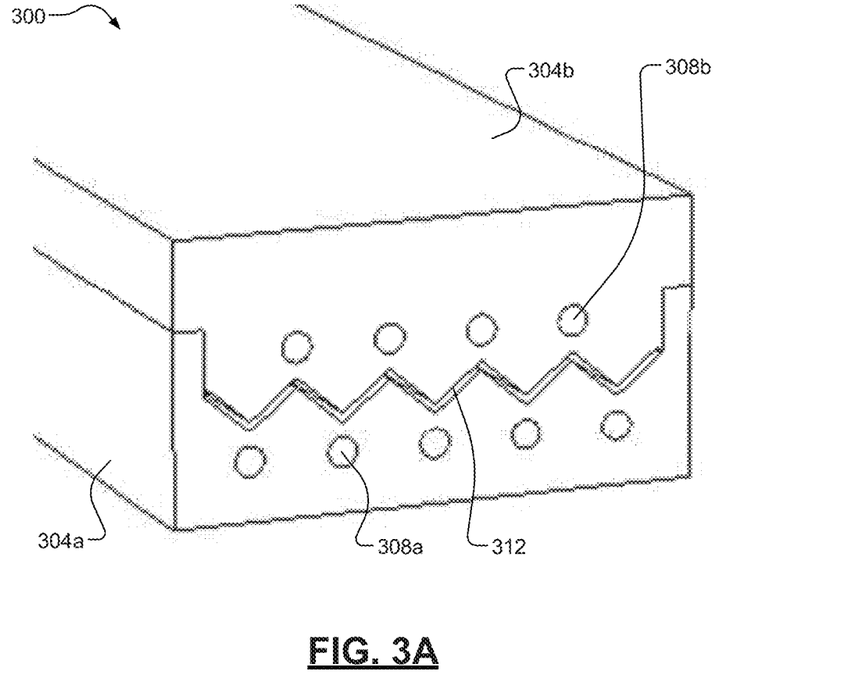
FIGS. 3A-3B are perspective and end or cross-sectional views of a tool having heating elements therein and configured for triangular waveform shaping of a portion of an FC according to some implementations of the present disclosure.
Figure 3B:
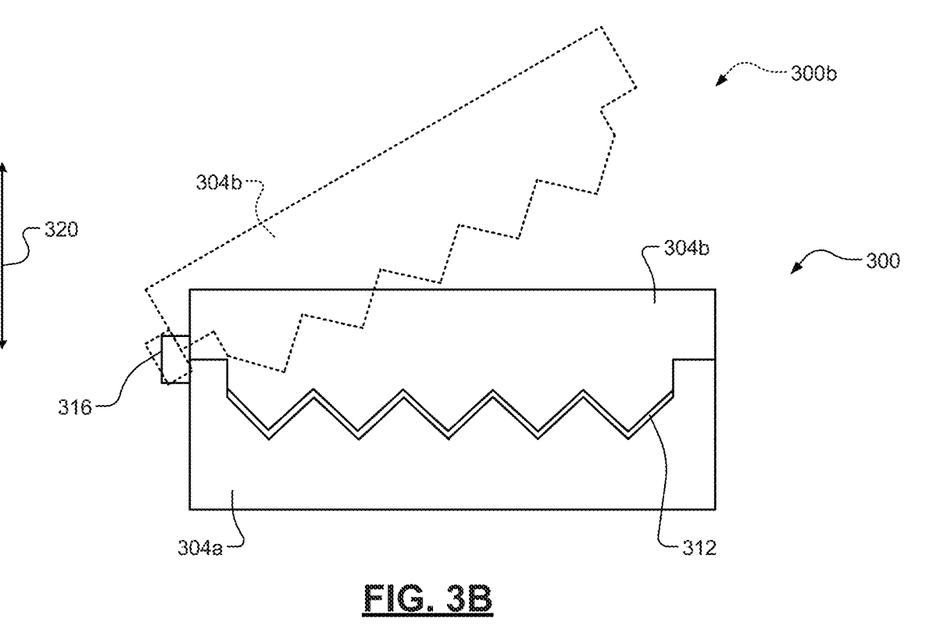

Referring now to FIGS. 3A-3B and with continued reference to FIG. 1B, the shaping system 150 comprises a non-conductive tool 154, 300 defining complimentary first and second tool portions 304a, 304b and a shape therebetween (e.g., a triangular waveform shape 312). Again, while a triangular waveform is shown and described herein, it will be appreciated that the shaped FC could define any suitable repeating or non-repeating shape profile, such as a sinusoidal waveform. The tool 154, 300 is configured to receive a portion of the unshaped or pre-processed FC therebetween the first and second tool portions. In one exemplary implementation, a clamp configuration is provided where the first and second tool portions 304a, 304b are connected by a living hinge 316 to provide clearance in a vertical direction 320 for insertion of the FC 100 therebetween. It will be appreciated that the tool 154, 300 could provide another suitable means for receiving the FC 100, such as insertion via an end and pressure/rolling the FC 100 therebetween the first and second tool portions 304a, 304b.

The tool 154 also comprises a set of conductive heating elements 158, 308a, 308b arranged substantially in parallel with each other and disposed within the first and second tool portions 304a, 304b. The heating elements 158, 304a, 304b are selectively powered by current from a power source 162, such as a battery or battery system. In some implementations, the power source 162 is a battery/battery system such that the shaping system 150 is mobile (e.g., a handheld unit), which could be preferable due to increased flexibility for installation. It will be appreciated that the power source 162 could also be a stationary power source, such as a traditional wall outlet. In some implementations, the shaping system 150 further comprises an output device 170 configured to generate an output (audio, visual, tactile, or some combination thereof) indicative of a status. For example, the output device 170 could illuminate a light and/or produce an audible noise when the shaping process is complete (e.g., when the conductive heating elements 158, 304a, 304b have received power for a sufficiently long period).

Figure 2A:
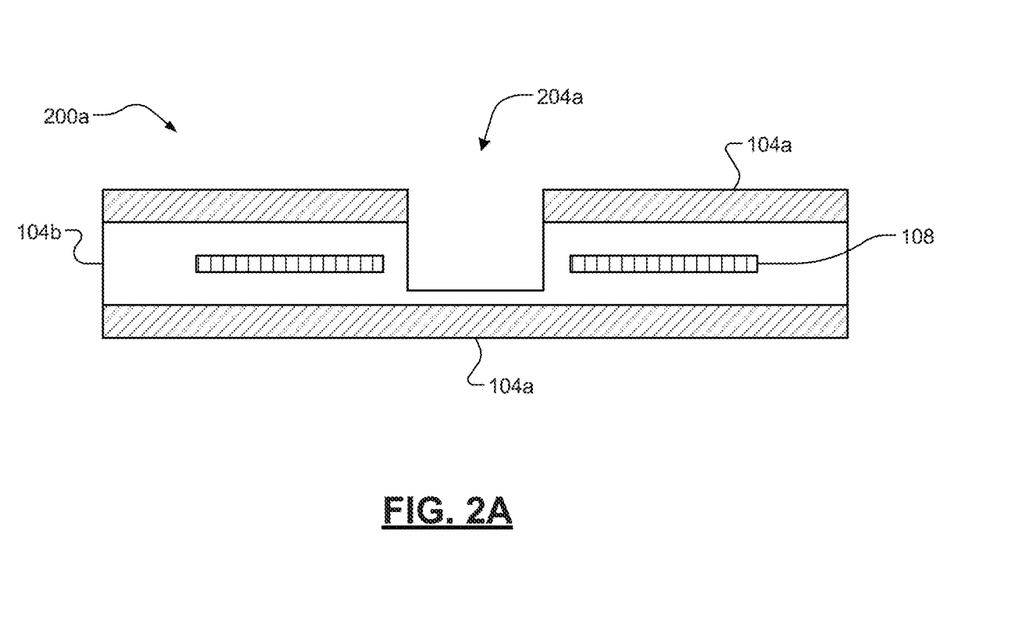
FIGS. 2A-2B are cross-sectional or end views of a pre-processed FC having a portion of the insulation layer(s) removed to further promote shaping according to some implementations of the present disclosure.
Figure 2B:
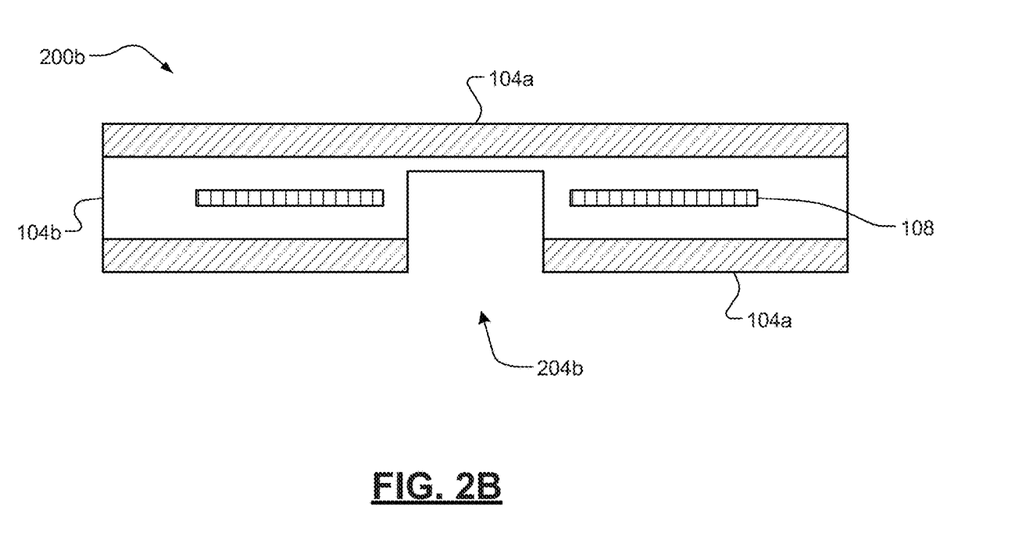

Referring now to FIGS. 2A-2B and with continued reference to the FIGS. discussed above, the shaping system 150 could optionally include or be associated with a laser processing or pre-processing system 166. This laser processing system 166 could be optionally used for laser processing of the unshaped FC prior to its insertion/shaping by the shaping system 150. For example, a top portion 204a (e.g., a slit) of both first and second insulation layers 104a, 104b could be removed by the laser processing system 166 and the shaped or pre-processed FC 200a could then be fed to the shaping system 150. Alternatively, for example, a bottom portion 204b (e.g., a slit) of both the first and second insulation layers 104a, 104b could be removed by laser processing system 166 and the shaped or pre-processed FC 200b could then be fed to the shaping system 150. This optional pre-processing could further assist in the formation/shaping of the FC 100, such as, for example only, FCs 100 having thicker or multiple insulation layers 104.

Figure 4A:
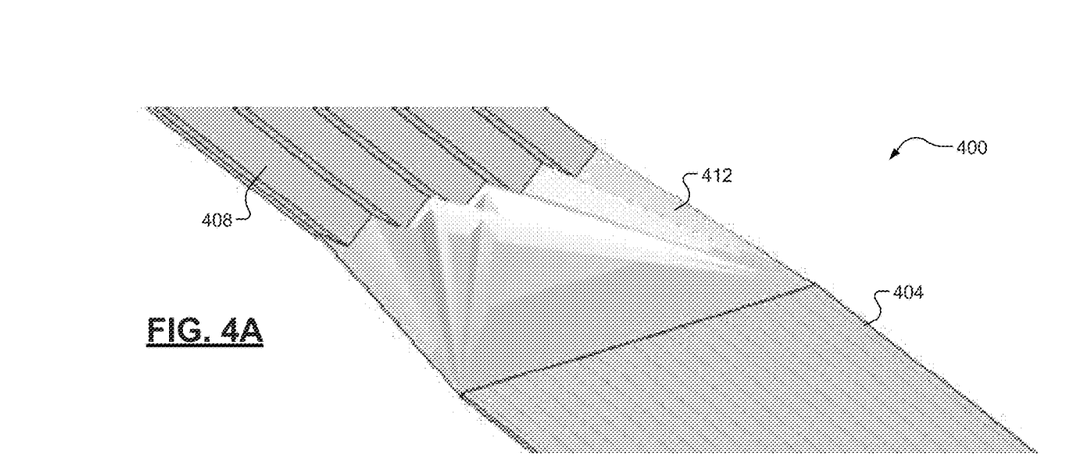
FIGS. 4A-4B are views of example FCs having triangular waveform shaped portions using the tool of FIG. 3 and routing/attachment thereof around a pole-type object according to some implementations of the present disclosure.
Figure 4B:
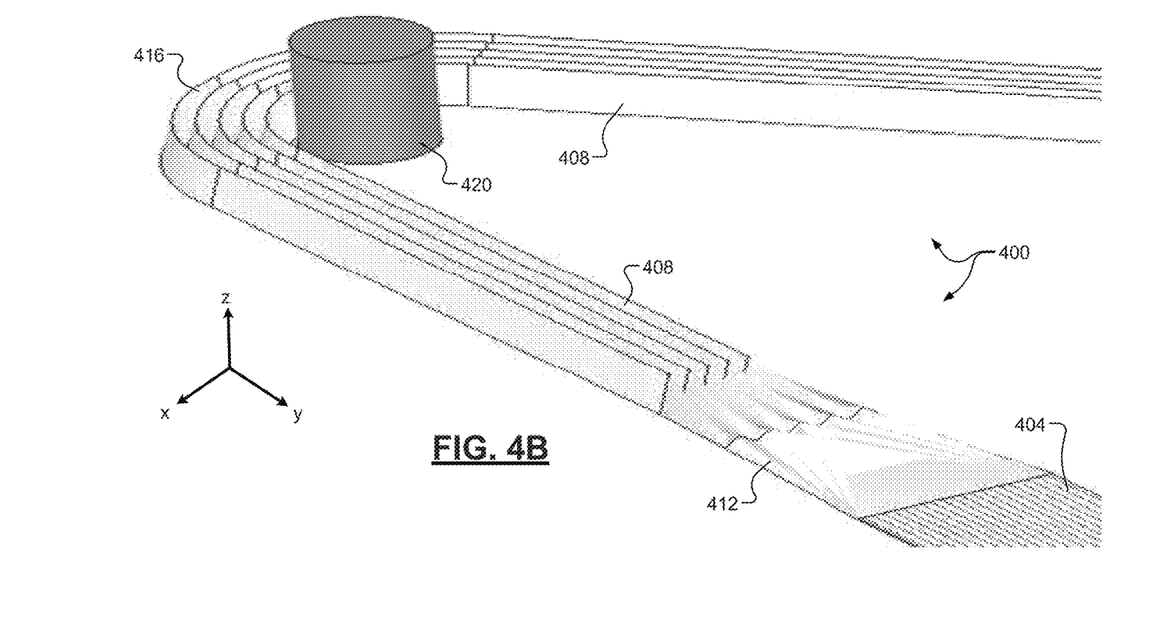

Referring now to FIGS. 4A-4B and with continued reference to FIGS. 3A-3B, views of an example FC 400 having triangular waveform shaped portions using the tool of FIGS. 3A-3B according to some implementations of the present disclosure are illustrated. As previously discussed, one potential shape is a triangular waveform shape defining a series of peaks and valleys relative to the first and second tool portions 304a, 304b. As shown in FIG. 3A, each conductive heating element 308a, 308b is substantially aligned with a respective peak-valley pair in one of the first and second tool portions 304a, 304b corresponding to a peak side of the respective peak-valley pair. In some implementations, some conductive heating elements 304a, 304b of the set of conductive heating elements 158 have different lengths such that the shaping achieves different widths of bends/folds in at least some of the set of insulation layers. In addition, only a portion of the length of the FC could be shaped/processed as shown in FIGS. 4A-4B. Of the entire FC 400, a first portion 404 is not processed/shaped and a second portion 408 is processed/shaped, with a transitional or bunched portion 412 therebetween. For example, only a portion of the FC 400 could be processed/shaped at a desired length point relative to an installation or routing feature, such as a pole-shaped object 420 as shown in FIG. 4B. As can be seen, the processed/shaped portion 408 easily bends around the pole-shaped object 420 at length point 416 to mitigate or prevent damage to the FC 400 (e.g., increased flexibility or bendability in the x-direction).

Figure 5A:
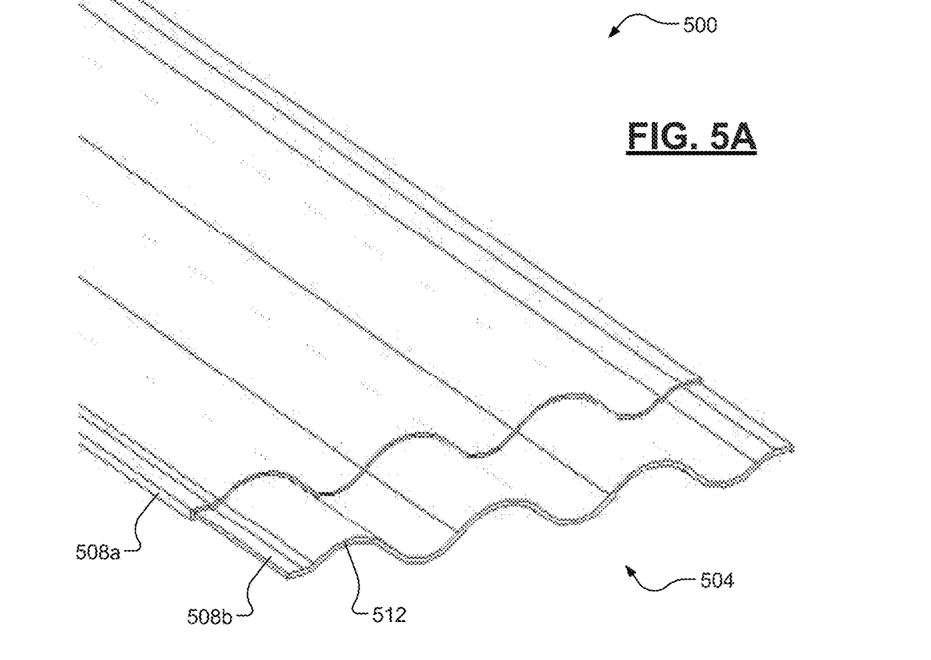
FIGS. 5A-5B are views of example FCs having sinusoidal waveform shaped portions according to some implementations of the present disclosure.
Figure 5B:
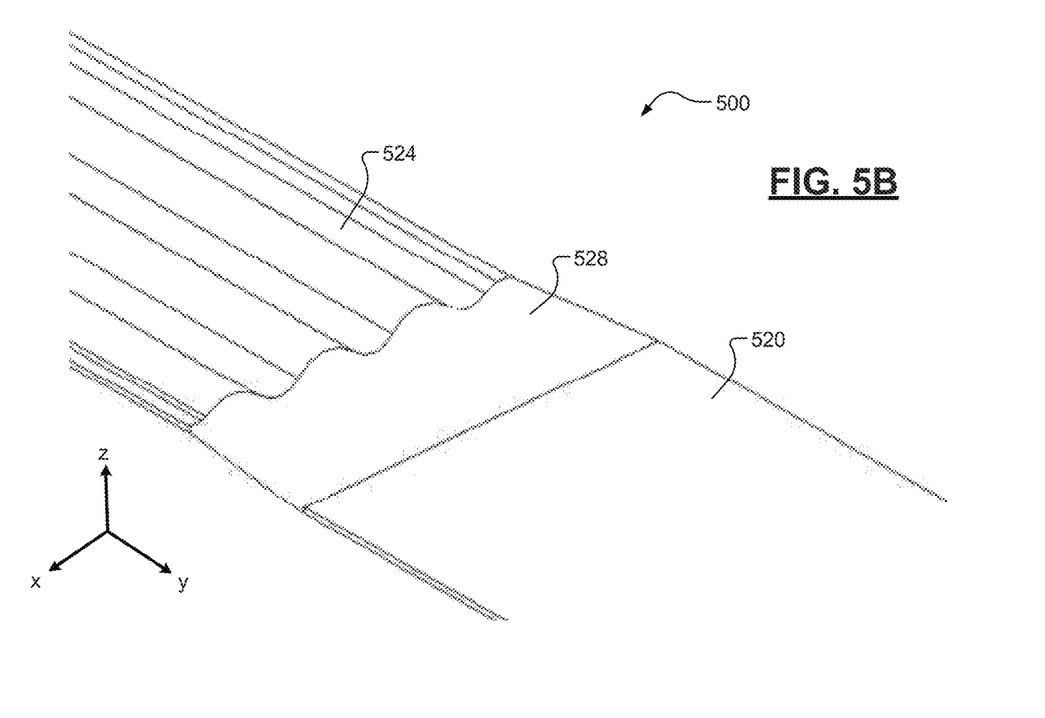

Referring now to FIGS. 5A-5B and with continued reference to the previous FIGS., views of another example FC 500 having sinusoidal waveform shaped portions 504 using a different (but similar) tool as shown in FIGS. 3A-3B according to some implementations of the present disclosure are illustrated. The tool (not shown) to form/shape the sinusoidal waveform shape 504 as shown would be similar to FIGS. 3A-3B but would be sinusoidal rather than triangular, with, for example, conductive heating elements arranged in similar locations along the waveform shape 504 (e.g., peaks/valleys). As shown in FIG. 5A, multiple insulation layers 508a, 508b are formed/shaped based on this waveform shape 504. One primary benefit or purpose of the configuration of FC 500 (longitudinally extending sinusoidal or "wavy" undulations) is the stiffening of the FC 500, 520 along its length (e.g., z-direction) or in specific sections 524 along its length (see FIG. 5B, with intermediate/transitionary bunched portion 528). While a regular/repeating sinusoidal waveform shape is illustrated, it will be appreciated that any suitable wavy undulating shape could be utilized to achieve the desired stiffening.

Figure 6:
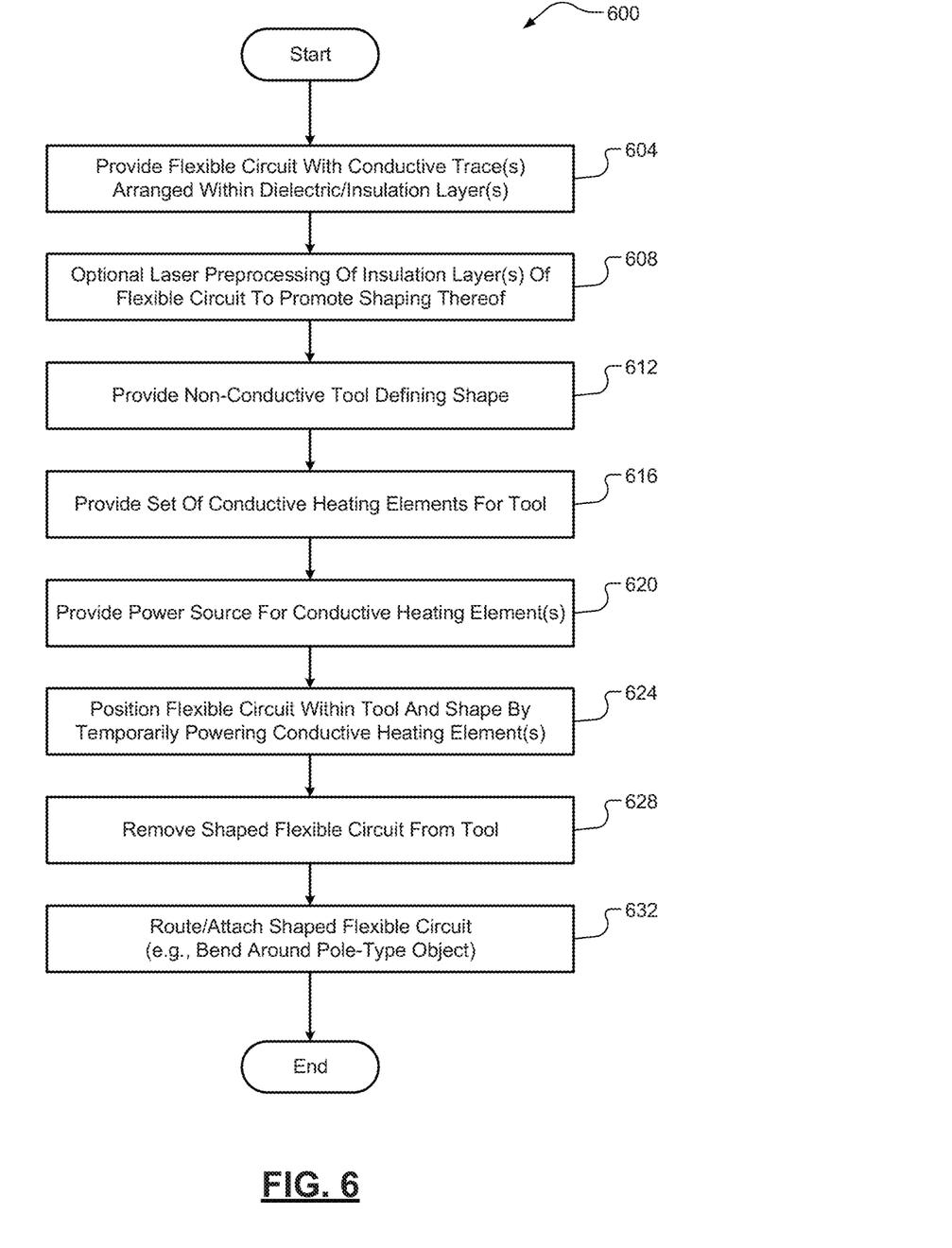
FIG. 6 is a flow diagram of an example method of shaping a portion of an FC, such as by providing and using the above-mentioned shaping system and tool/heating element(s), according to some implementations of the present disclosure.

Referring now to FIG. 6, a flow diagram of an example method 600 of shaping a portion of an FC using a system or tool/heating element(s) according to some implementations of the present disclosure is illustrated. At 604, an FC is provided with conductive trace(s) disposed between dielectric or insulation layer(s). At 608, optional laser preprocessing is performed to remove portion(s) of the insulation layer(s) to further promote or assist with the subsequent processing/shaping. At 612, a non-conductive tool defining a shape (triangular, sinusoidal, etc.) is provided. At 616, conductive heating element(s) are provided, such as within portions of the tool. At 620, a power source (stationary or mobile, such as a battery pack/system) is provided to selectively power the heating element(s). At 624, the FC is positioned within or relative to the tool and subsequently shaped by temporarily powering the heating element(s) using the powers source (e.g., until an end/complete indication is output or generated by an output device). At 628, the final processed/shaped FC is removed from the tool and then routed/attached in a desired environment, such as bending around a pole-type object in a vehicle electrical system. The method 600 then ends or returns to 604 for one or more additional cycles.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known procedures, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The term "and/or" includes any and all combinations of one or more of the associated listed items. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Some portions of the above description present the techniques described herein in terms of algorithms and symbolic representations of operations on information. These algorithmic descriptions and representations are the means used by those skilled in the data processing arts to most effectively convey the substance of their work to others skilled in the art. These operations, while described functionally or logically, are understood to be implemented by computer programs. Furthermore, it has also proven convenient at times to refer to these arrangements of operations as modules or by functional names, without loss of generality.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A system for shaping a flexible circuit (FC) including a set of conductive traces disposed within a set of insulation layers, the system comprising:
    a non-conductive tool defining complimentary first and second tool portions and a shape therebetween, the tool being configured to receive a portion of the FC therebetween the first and second tool portions;
    a set of conductive heating elements arranged substantially in parallel with each other and disposed within the first and second tool portions; and
    a power source configured to provide power to the conductive heating elements causing the conductive heating elements to generate heat energy to shape the FC portion without removing any of the FC portion.

2. The system of claim 1, wherein the shape is a waveform shape defining a series of peaks and valleys relative to the first and second tool portions.

3. The system of claim 2, wherein each conductive heating element is substantially aligned with a respective peak-valley pair in one of the first and second tool portions corresponding to a peak side of the respective peak-valley pair.

4. The system of claim 2, wherein the waveform shape is a triangular waveform shape for increasing flexibility or bendability of the FC perpendicular to its length.

5. The system of claim 2, wherein the waveform shape is a sinusoidal waveform shape for increasing rigidity or stiffness of the FC along its length.

6. The system of claim 1, wherein the first and second tool portions are arranged in a clamp configuration joined on one respective side by a hinge member and moveable relative to each other such that:
    when the first and second tool portions are separated from each other in an open position, the FC portion is positionable therein; and
    when the first and second tool portions are proximate to each other in a closed position, the FC portion is secured therein for shaping.

7. The system of claim 1, wherein the first and second portions are fixed relative to each other defining a slot or gap therebetween for insertion and shaping of the FC portion therebetween.

8. The system of claim 1, wherein some conductive heating elements of the set of conductive heating elements have different lengths such that the shaping achieves different widths of bends/folds in at least some of the set of insulation layers.

9. The system of claim 1, further comprising a laser processing system configured to pre-process the FC portion to etch or remove a portion of the set of insulation layers in an area of the FC portion to promote the subsequent shaping.

10. The system of claim 1, wherein the power source is a battery system such that the system is movable to any desired position.

11. The system of claim 1, further comprising an output device configured to generate at least one of an audible, visual, and tactile output after a shaping period of providing power to the set of conductive elements to shape the FC portion, wherein the shaping period has a sufficient duration to complete the shaping of the FC portion.

12. A method of shaping a flexible circuit (FC) including a set of conductive traces disposed within a set of insulation layers, the method comprising:
providing a non-conductive tool defining complimentary first and second tool portions and a shape therebetween, the tool being configured to receive a portion of the FC therebetween the first and second tool portions;
providing a set of conductive heating elements arranged substantially in parallel with each other and disposed within the first and second tool portions;
providing a power source configured to provide power to the conductive heating elements causing the conductive heating elements to generate heat energy;
positioning the FC portion within the tool; and
providing power to the conductive heating elements to shape the FC portion without removing any of the FC portion.

13. The method of claim 12, wherein the shape is a waveform shape defining a series of peaks and valleys relative to the first and second tool portions.

14. The method of claim 13, wherein each conductive heating element is substantially aligned with a respective peak-valley pair in one of the first and second tool portions corresponding to a peak side of the respective peak-valley pair.

15. The method of claim 13, wherein the waveform shape is a triangular waveform shape for increasing flexibility or bendability of the FC perpendicular to its length.

16. The method of claim 13, wherein the waveform shape is a sinusoidal waveform shape for increasing rigidity or stiffness of the FC along its length.

17. The method of claim 12, wherein the first and second tool portions are arranged in a clamp configuration joined on one respective side by a hinge member and moveable relative to each other such that:
when the first and second tool portions are separated from each other in an open position, the FC portion is positionable therein; and
when the first and second tool portions are proximate to each other in a closed position, the FC portion is secured therein for shaping.

18. The method of claim 12, wherein the first and second portions are fixed relative to each other defining a slot or gap therebetween for insertion and shaping of the FC portion therebetween.

19. The method of claim 12, wherein some conductive heating elements of the set of conductive heating elements have different lengths such that the shaping achieves different widths of bends/folds in at least some of the set of insulation layers.

20. The method of claim 12, further comprising:
providing a laser processing system configured to etch or remove a portion of the set of insulation layers of the FC; and
pre-processing the FC portion with the laser processing system to promote the subsequent shaping.

21. The method of claim 12, wherein the power source is a battery system such that the tool with the set of conductive heating elements therein is movable to any desired position.

22. The method of claim 12, further comprising:
providing an output device configured to generate at least one of an audible, visual, and tactile output; and
actuating the output device after a shaping period of providing power to the set of conductive elements to shape the FC portion, wherein the shaping period has a sufficient duration to complete the shaping of the FC portion.

* * * * *